(12) United States Patent
Thuries et al.

(10) Patent No.: US 10,230,378 B2
(45) Date of Patent: Mar. 12, 2019

(54) PHASE SHIFTER

(71) Applicant: NXP B.V., Eindhoven (NL)

(72) Inventors: Stephane Thuries, Saubens (FR);
Cristian Pavao Moreira, Frouzins (FR); Gilles Montoriol, Plaisance du Touch (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/021,143

(22) Filed: Jun. 28, 2018

(65) Prior Publication Data
US 2019/0013814 A1 Jan. 10, 2019

(30) Foreign Application Priority Data

Jul. 7, 2017 (EP) .................................. 17305886

(51) Int. Cl.
| | |
|---|---|
| H03L 7/08 | (2006.01) |
| H03L 7/081 | (2006.01) |
| H03M 1/66 | (2006.01) |
| G01S 13/28 | (2006.01) |
| G01S 13/70 | (2006.01) |
| H04B 1/44 | (2006.01) |

(52) U.S. Cl.
CPC .......... *H03L 7/0814* (2013.01); *G01S 13/288* (2013.01); *G01S 13/70* (2013.01); *H03M 1/665* (2013.01); *H04B 1/44* (2013.01)

(58) Field of Classification Search
CPC combination set(s) only.
See application file for complete search history.

(56) References Cited

U.S. PATENT DOCUMENTS

| | | | |
|---|---|---|---|
| 7,349,677 B2* | 3/2008 | Jensen | ................ H04L 27/0014 375/296 |
| 7,379,516 B2* | 5/2008 | Dati | ................. G11B 20/10009 375/232 |
| 7,545,856 B2 | 6/2009 | Behzad et al. | |
| 8,737,531 B2 | 5/2014 | Saunders | |
| 2008/0278370 A1 | 11/2008 | Lachner et al. | |
| 2011/0085616 A1 | 4/2011 | Kuttner | |
| 2012/0263260 A1 | 10/2012 | Van Waasen | |

* cited by examiner

*Primary Examiner* — An T Luu

(57) ABSTRACT

The disclosure relates to a phase shifter having a first mode of operation and a second mode of operation, the phase shifter comprising a mixer stage configured to mix an oscillator signal with an analog signal to provide a phase shifted signal, switching circuitry and a controller arranged to provide the analog signal to the mixer stage as a voltage in the first mode of operation and as a current in the second mode of operation.

20 Claims, 7 Drawing Sheets

PHASE SHIFTER

CROSS-REFERENCE TO RELATED APPLICATIONS

This application claims the priority under 35 U.S.C. § 119 of European Patent application no. 17305886.8, filed on 7 Jul. 2017, the contents of which are incorporated by reference herein.

BACKGROUND

Field

The present disclosure relates to a phase shifter. In particular, although not exclusively, the disclosure relates to a radio detection and ranging (radar) device with a transmitter comprising a phase shifter.

Related Art

Phase rotators or phase shifter (PS) circuits are often used in communication systems, and more specifically in transceivers. Particularly in radar systems, a phase shifter may be placed in the transmitter path, allowing beam forming, which increases radar resolution.

A problem with existing phase shifter circuits relates to reducing total noise in an output of the phase shifter to acceptable levels for use in an integrated transceiver, for example. A further problem relates to reducing power consumption of the phase shifter or a transmitter comprising the phase shifter.

BRIEF DESCRIPTION OF THE DRAWINGS

One or more embodiments will now be described by way of example only with reference to the accompanying drawings in which.

DETAILED DESCRIPTION

Figure 1:
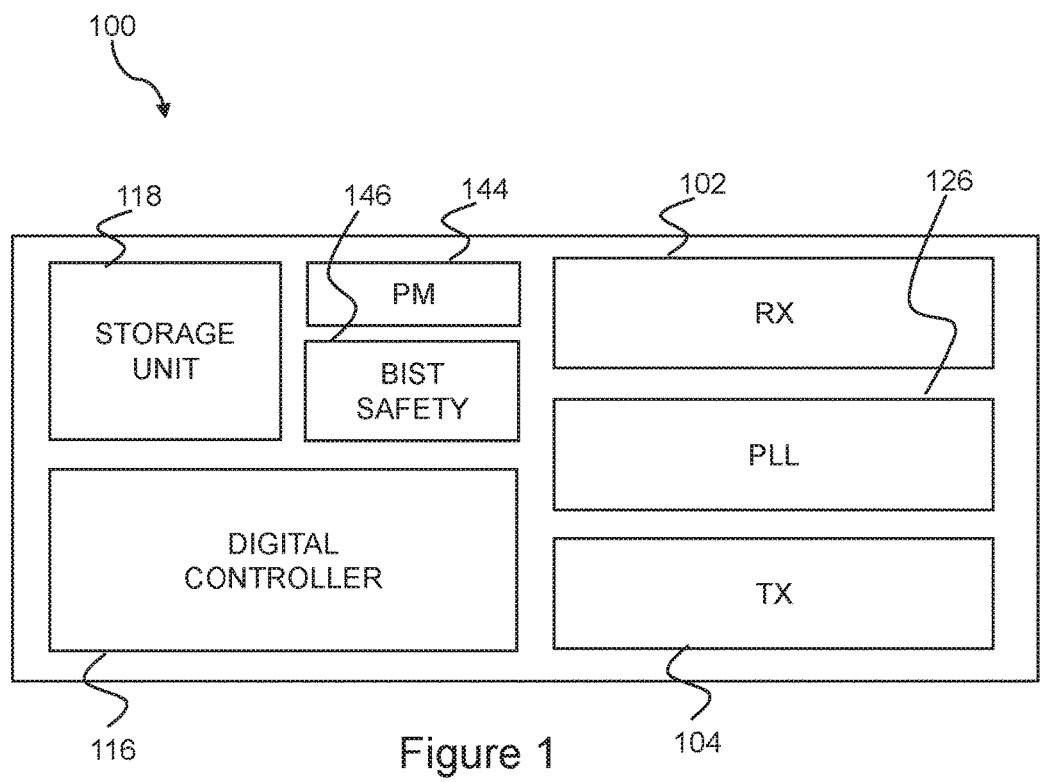
FIG. 1 shows a simplified block diagram of a RADAR device.

According to a first aspect of the present disclosure there is provided a phase shifter circuit having an active state and an inactive state, the phase shifter circuit comprising:
 a digital-to-analogue converter configured to receive a control signal indicative of a desired phase shift and to provide an analogue current in accordance with the desired phase shift;
 a mixer stage configured to mix an oscillator signal with the analogue current to provide a phase shifted signal; and
 control circuitry configured to provide the oscillator signal to the mixer stage in accordance with the state of the phase shifter to activate or deactivate the mixer stage.

The disclosure proposes a fast current driven PS topology presenting very low output noise and circuitry for powering up/down the phase shifter during an interchirp period of a radar receiver frequency-modulated continuous-wave (FMCW) frame, thereby reducing total radar device power consumption.

In one or more embodiments, the control circuitry is configured to receive a raw oscillator signal and to supply an adjusted oscillator signal to the mixer stage in accordance with the state of the phase shifter.

In one or more embodiments, the control circuitry comprises a switchable bias source. The control circuitry may comprise switching circuitry. The control circuitry, optionally including the switchable bias source and switching circuitry, may be configured to apply a first bias level to the mixer stage in the active state to activate the mixer stage. The control circuitry, optionally including the switchable bias source and switching circuitry, may be configured to apply a second bias level to the mixer stage in the inactive state to deactivate the mixer stage. The second bias level may be different from the first bias level. The second bias level may be a ground level.

In one or more embodiments, the mixer stage and digital-to-analogue converter are arranged such that application of the second bias level to the mixer stage reduces a potential difference between an output of the digital-to-analogue converter at which the analogue current is provided and ground. The application of the second bias level to the mixer stage may eliminate the potential difference between an output of the digital-to-analogue converter at which the analogue current is provided and ground.

In one or more embodiments, the control circuitry comprises a balun with a first inductor and a second inductor. The first inductor may be configured to receive an unbalanced oscillator signal. The second inductor may be configured to provide a balanced signal to a mixer of the mixer stage, optionally at end taps of the second inductor, in accordance with the bias applied by the control circuitry, optionally to a centre tap of the second inductor. The control circuitry may be configured to activate the mixer stage at the start of the active state. The control circuitry may be configured to deactivate the mixer stage at the start of the active state. The switchable bias voltage source may be switchably connected to the balun. The switchable bias voltage source may be switchably connected to the centre tap of the first inductor of the balun.

In one or more embodiments, the digital-to-analogue converter, DAC, is a current-summing converter with a plurality of units. The phase shifter circuit may further comprise a DAC DAC bias voltage source, which may optionally comprise a reference current. The phase shifter circuit may further comprise a filter. The DAC bias voltage source and/or filter may be configured to provide a DAC bias voltage to each of the units of the digital-to-analogue converter. Each unit of the digital-to-analogue converter may represent one bit of the digital-to-analogue converter.

In one or more embodiments, the DAC bias voltage source is configured to provide the DAC bias voltage to the digital-to-analogue converter in both the active state and the inactive state.

In one or more embodiments, each unit comprises a first DAC switch, a second DAC switch and a field effect transistor with a gate connected to the DAC bias voltage and a conduction channel connected to the first and second DAC switches.

In one or more embodiments, the mixer comprises first, second, third and fourth transistors. The first and second transistors may each have a first junction coupled to the first DAC switches for receiving a current. The third and fourth transistors may each have a first junction coupled to the second DAC switches for receiving a current. The second and fourth transistors may each have second junctions for providing an output of the mixer. The first and third transistors may each have second junctions for providing a second output of the mixer. The second and third transistors may each have a control terminal for receiving a first balanced oscillator signal. The first and fourth transistors may each have a control terminal for receiving a second balanced oscillator signal.

In one or more embodiments, the mixer stage comprises an in-phase mixer, a quadrature mixer and a power combiner configured to combine output signals from the in-phase and quadrature mixers. A balun and DAC may be provided for each of the in-phase and quadrature mixers.

According to a further aspect there is provided a transmitter module having a ramp-up state and a ramp-down state, comprising the phase shifter circuit of any preceding claim and a controller configured to send a control signal to the control circuitry of the phase shifter circuit to set bias in accordance with the state of the transmitter.

In one or more embodiments, the transceiver is a radar transceiver.

According to a further aspect there is provided a method of shifting a phase of an oscillator signal, comprising:
  receiving a digital control signal indicative of a desired phase shift
  providing an analogue current in accordance with the desired phase shift;
  setting an oscillator signal in accordance with an active state or an inactive state; and
  mixing the oscillator signal with the analogue current to provide a phase shifted signal.

According to a further aspect there is provided a computer program code configured to enable a processor to perform any method disclosed herein. A non-transient computer-readable storage medium may comprise the computer program code.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

FIG. 1 shows a simplified block diagram of a RADAR device has a standard system layout. The radar device 100 comprises a radar transceiver with a receiver module 102 and a transmitter module 104.

The receiver module may comprise, for example, a millimeter wave front end (MMW FE) coupled to a receiver input and configured to provide a signal to a baseband, composed of variable gain amplifiers and filters. Signals passed by the baseband may be converted from the analogue-to-digital domain by an analogue-to-digital converter in order to provide a digital output of the receiver module 102.

The transmitter module 104 is connected to a digital controller 116. The digital controller 116 comprises a direct digital synthesiser (DDS). A storage unit 118 is provided for interrogation by the digital controller 116 during operation. The output of the DDS may be provided by the digital controller 116 to the transmitter module 104. An output of a phase lock loop (PLL) circuit 126 may also be provided to the transmitter module 104. The phase lock loop circuit 126 may comprises a voltage controlled oscillator and buffers, as is known in the art.

The radar device 100 also comprises a power management module 144 and built-in self-test safety system 146, which may operate in a conventional fashion. The radar device 100, or part thereof, may be implemented using CMOS technology.

In communication systems in which the antenna is shared between a transmitter and a receiver (Radar, FDD systems, etc.), a limited isolation exists between the transmitter (TX) and the receiver (RX). For FDD systems (like WCDMA, LTE), an external high selectivity filter is generally placed between the antenna and the transceiver in order to mitigate the limited isolation. In Radar systems, it may be that no filter is placed between the antenna and the transceiver, and the TX noise power can couple to the RX input due to the limited TX-to-RX isolation and then increase the intrinsic receiver noise figure (NF), which may be referred to as NF desensitization. This degrades the full system sensitivity. In order to relax the NF dependence on limited isolation (at the silicon level or board level), the transmitter output noise power (the sum of the phase noise and amplitude noise coming from all TX blocs) must be kept below a given level. When placed in a transmitter chain, the phase shifter (PS) or phase rotator is often the main noise contributor, due mainly to circuit architecture.

A current-driven phase shifter for a radar transmitter application is described below with reference to FIGS. 2 to 5. The use of a current-driven phase shifter addresses the requirement to reduce the noise component associated with the phase shifter because it avoids a voltage-to-current transformation that may be required in a transconductance stage of a voltage-driven phase shifter. Such a voltage-to-current transformation translates AM noise to Phase Noise.

In frequency-modulated continuous-wave (FMCW) radar applications, it is advantageous often need to turn off some functional blocks during the interchirp time (dead time) in order to reduce total power consumption. For advanced fast modulation schemes, the interchirp time is well below the chirp time (Tchirp=10 μs, Tinter=1 μs), resulting in a relatively high proportion of the time that data can be transmitted. However, this requirement constrains the power-down to power-up transition time of the transceiver blocks, and in particular for the transition time at the transmitter. The proposed low noise current mode architecture includes additional circuitry to allow fast power-down and power-up of the PS to reduce power consumption.

Figure 2A:
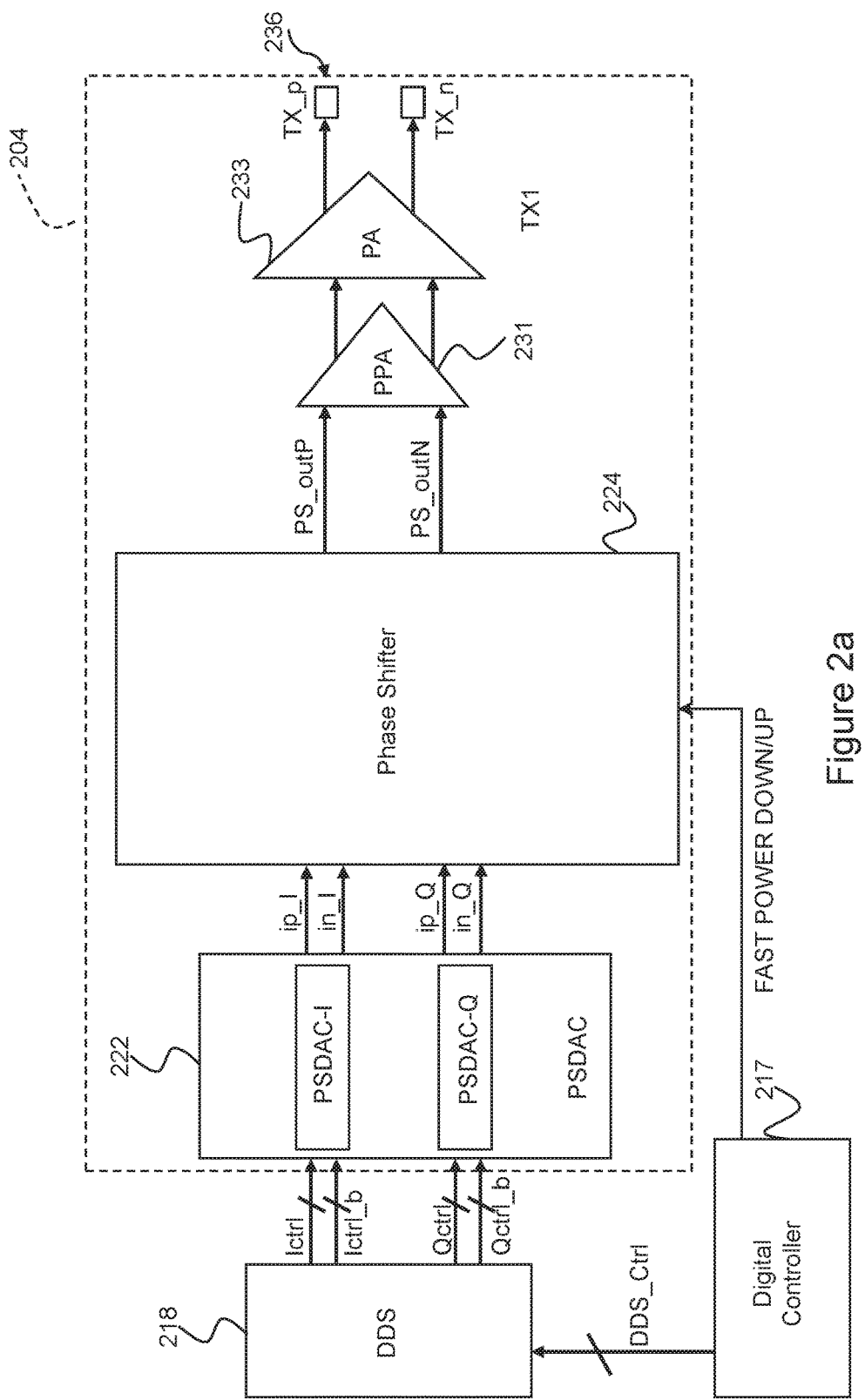
FIG. 2a shows a simplified block diagram of a transmitter module.

FIG. 2a shows a simplified block diagram of a transmitter module 204. The transmitter module 204 is couple to a digital controller 217 and a DDS 218.

The transmitter module 204 has separate in-phase and quadrature paths, which are processed in parallel. The in-phase and quadrature signal paths each comprise a series arrangement of the DDS 218, phase shifter DAC 222, phase shifter 224, a pre-power amplifier 231 and a power amplifier 233. The power amplifier 233 provides an output signal 236 for the transmitter module 204.

The digital controller 217 provides a control signal DDS_Ctrl to the DDS 218. The DDS 218 provides an in-phase control signal I_Ctrl and a quadrature control signal Q_Ctrl to respective in-phase and quadrature DACs within the PS DAC 222. The in-phase and quadrature DACs within the PS DAC 222 convert the digital control codes in the in-phase and quadrature control signals I_Ctrl, Q_Ctrl to analogue signals. Each of the in-phase and quadrature DACs of the PS DAC 222 provide one or more analogue signals ip_I, in_I, ip_Q, in_Q to drive the phase shifter 224. In this example, the one or more analogue signals ipl_I, in_I, ip_Q, in_Q are balanced signals. The phase shifter 224 provides one or more phase shifter output signals PS_outP, PS_outN having the required phase programmed by the DDS 218, which can be amplified by the pre-power amplifier 231 and the power amplifier 233 to provide the transmitter output 236. In this way, the digital controller 217 enables a static output phase or a given IF frequency (dynamic operation) at PS DAC outputs PS_outP, Ps_outN.

Figure 2B:
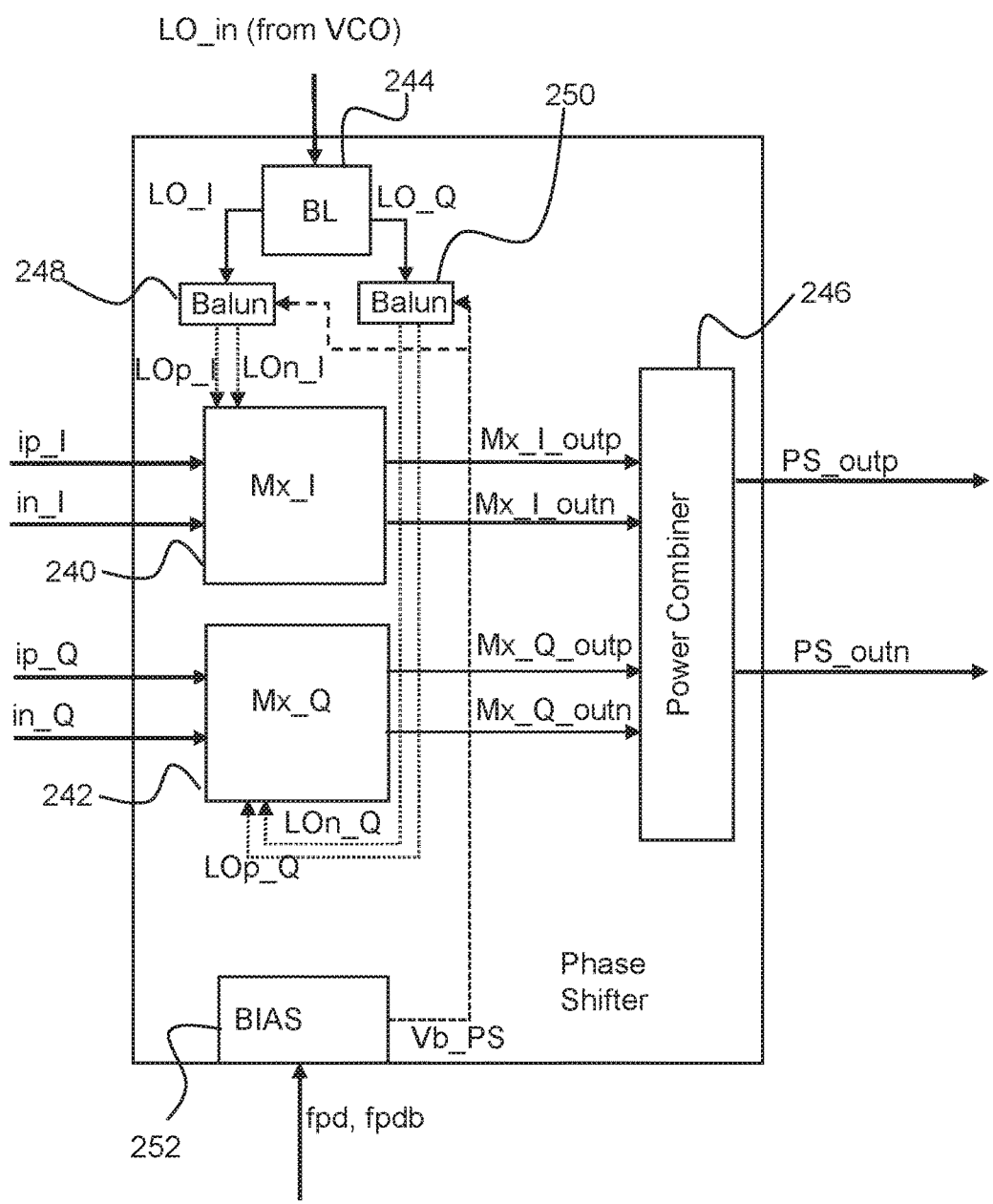
FIG. 2b shows a simplified block diagram of phase shifter.

The digital controller 217 also provides to the phase shifter 224 a control bit corresponding to a power up/power down timing status. The control bit logic level is dependent on, or corresponds to, a radar device ramp state. When the radar device is ramping up, the phase shifter is controlled to be in an active state. When the radar device is ramping down, the phase shifter is controlled to be in an inactive state FIG. 2b shows a simplified block diagram of a phase shifter 224 for performing in-phase and quadrature processing. The phase shifter 224 has an active state and an inactive state. The phase shifter 224 comprises an in-phase mixer 240, a quadrature mixer 242, a branch line coupler 244, a power combiner 246 an in-phase balun 248 and a quadrature balun 250.

The branch line coupler 244, in-phase balun 248 and quadrature balun 250 together convert an unbalanced local oscillator input signal LO_in, which may be considered as a raw oscillator signal, into balanced local oscillator signals LOp_I, LOn_I for the in-phase mixer 240 and balanced local oscillator signals LOp_Q, LOn_Q for the quadrature mixer 242. Each balun 248, 250 receives a bias from a bias unit 252 and provides the respective balanced in-phase and quadrature local oscillator signals LOp_I, LOn_I, LOp_Q, LOn_Q to set a common mode voltage of the mixers 240, 242 in accordance with the received bias. The bias unit 252 is configured to receive a control signal from the controller 217 (in FIG. 2a) and set the bias in accordance with whether the phase shifter is required in an active state or an inactive state. In this way, the bias unit 252, branch line coupler 244, in-phase balun 248 and quadrature balun 250 provide control circuitry configured to apply a bias to the mixer stage in accordance with the state of the phase shifter to activate or deactivate the mixer stage.

The in-phase mixer 240 mixes the balanced local oscillator signal LOp_I, LOn_I with the balanced in-phase analogue signals ip_I, in_I to provide in-phase mixer output signals Mx_I_outp. Mx_I_outn to the power combiner 246. The quadrature mixer 242 mixes the balanced local oscillator signals LOp_Q, LOn_Q with the quadrature phase analogue signal ip_Q, in_Q to provide mixer output signals Mx_Q_outp, Mx_Q_outn to the power combiner 246. The in-phase and quadrature mixer output signals Mx_I_outp, Mx_I_outn, Mx_Q_outp, Mx_Q_outn may be voltage signals. The power combiner 246 combines the in-phase and quadrature mixer output signals Mx_I_outp, Mx_I_outn, Mx_Q_outp, Mx_Q_outn to provide phase shifter output signals PX_outp, PS_outn, a differential output with the programmed phase. In this example, the input and output signals of the power combiner 246 are all balanced signals.

Figure 3:
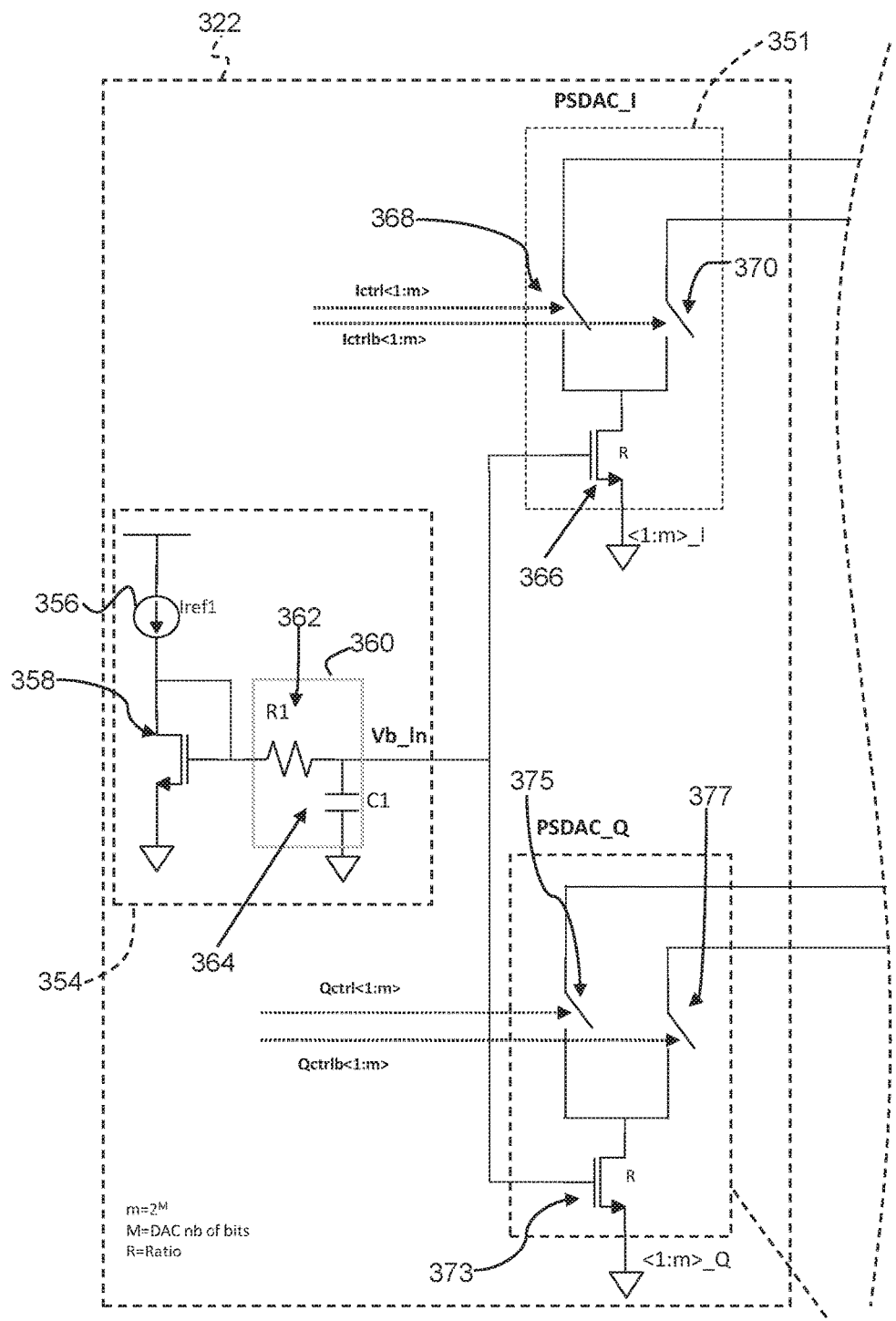
FIG. 3 shows a schematic profile of a phase shifter digital-to-analogue converter and mixer module of a phase shifter.
Figure 3:
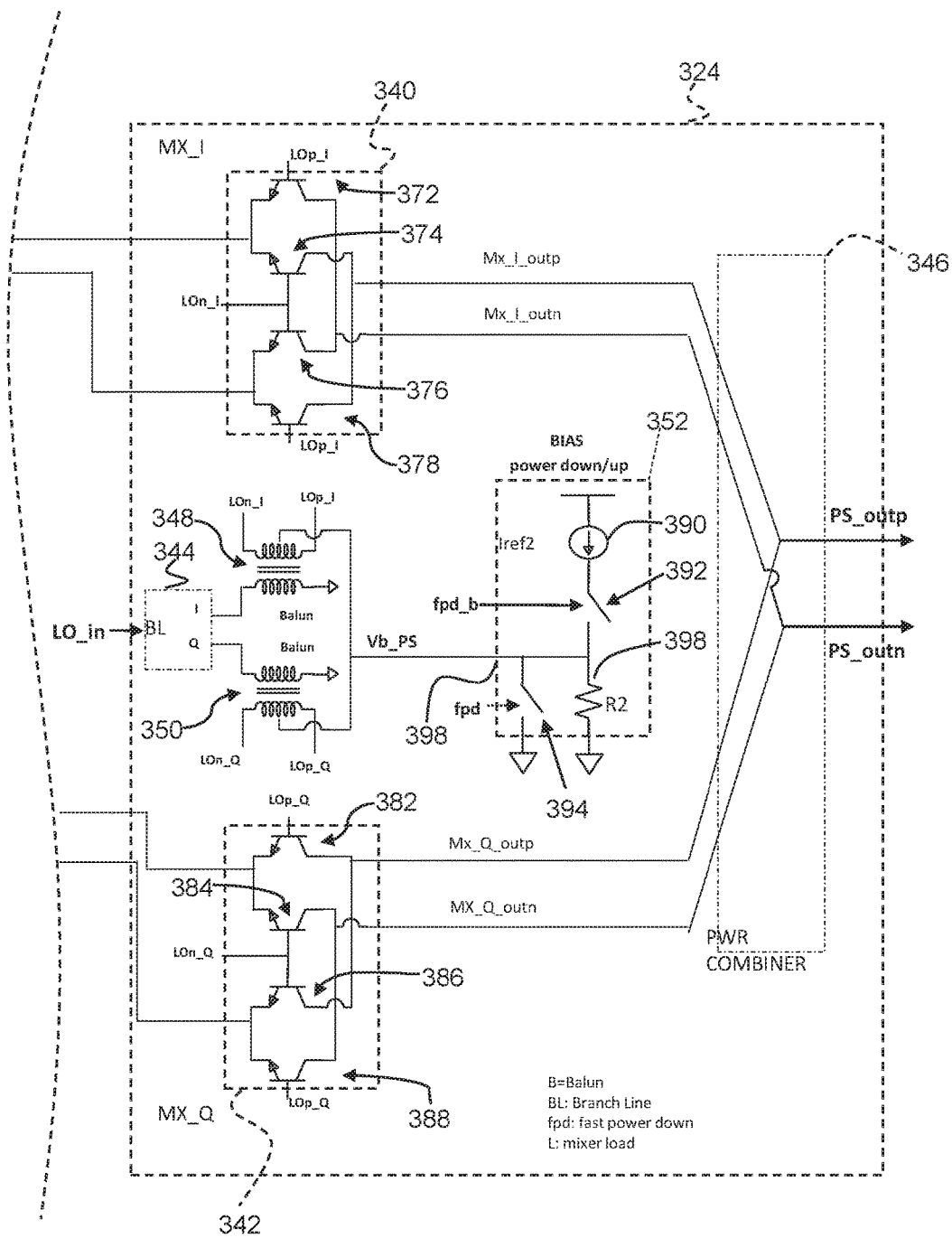

FIG. 3 shows a schematic profile of a phase shifter digital-to-analogue converter (PSDAC) 322 and mixer module of a phase shifter 324.

The phase shifter digital-to-analogue converter (PSDAC) 322 comprises an in-phase PSDAC 351, a quadrature PSDAC 353 and a bias source 354. A bias output Vb_In of the bias source 354 is provided to the in-phase and quadrature PSDACs 351, 353.

The bias source 354 comprises a current source 356 provided in series with the conduction channel of a bias field effect transistor (FET) 358. A source of the bias FET 358 is coupled to ground. A gate of the bias FET 358 is coupled to a drain of the bias FET 358 and the current source 356. The bias output Vb_In is provided by the bias source 354 via an RC filter 360. The RC filter 360 comprises a resistor 362 and a capacitor 364 provided in series between the drain of the bias FET 358 and ground. The bias output Vb_In of the bias source 354 is provided at a node between the resistor 362 and the capacitor 364. The RC filter 360 cuts out noise from the current source 356 that may otherwise affect operation of the circuit. The current source 356 may have a value of 100 μA, for example. Resettling time of the bias source 354 is compromised by the presence of the RC filter 360. Due to the presence of the RC filter 360, it may be impracticable to turn the current source 356 on and off dependent on the state of the phase shifter. The bias source 354 may therefore provide a static output to the PSDACs 351, 353 in both the active and inactive states of the phase shifter. Keeping the bias source 354 running during the inactive states enables the circuit to recover faster at the start of the active period, at a cost of the minimal power loss due to the provision of the current source 356 during the inactive period.

Each PSDAC 351, 353 comprises a plurality of units 1:m corresponding to bits of the respective PSDACs 351, 353. A single unit of each of the PSDACs 351, 353 is illustrated for clarity in FIG. 3. The same bias output Vb_In of the bias source 354 is provided to each bit of the PSDACs 351, 353.

Each unit of the in-phase PSDAC 351 comprises a DAC field effect transistor (FET) 366, a first switch 368 and a second switch 370. The DAC FET 366 of the unit has a gate coupled to receive the bias signal from the bias source 354. The DAC FET 366 of the unit also has a conduction channel with a drain connected to the first and second switches 368, 370 and a source connected to ground. The DAC FET 366 of each unit generates the same current because they all receive the same bias output Vb_In from the bias source 354. The first and second switches are controlled such that the first switch 368 is in the inverse state to the second switch 370. The first switch 368 receives a bit of the in-phase control signal Ictrl<1:m> from the DDS as described previously with reference to FIG. 2. The second switch 370 receives the inverse of the bit of the control signal Ictrlb<1:m>.

In the in-phase path, outputs from the first and second switches 368, 370 of each of the units 1:m of the PSDAC 351 are summed and provided to an in-phase mixer 340. The in-phase mixer 340 in this example comprises first, second, third and fourth bipolar transistors 372, 374, 376, 378. The bipolar transistors are NPN transistors in this example. The first and second bipolar transistors 372, 374 each have their emitters connected together and coupled to the first switches 368 of the in-phase PSDAC 351 for receiving a current to drive the phase shifter. The third and fourth bipolar transistors 376, 378 each have their emitters connected together and coupled to the second switches 370 of the in-phase 1o PSDAC 351 for receiving a current to drive the phase shifter. Driving the mixers of the phase shifter in current mode driving enables a reduction in output noise (phase noise and amplitude noise) and therefore considerably reduces NF desense issues in a transceiver context compared to a voltage drive phase shifter. The collectors of the second and fourth bipolar transistors 374, 378 provide an output of the in-phase mixer 340. The collectors of the first and third bipolar transistors 372, 376 provide a second output of the mixer 340. The bases of the second and third bipolar transistors 374, 376 are coupled to receive a first balanced signal LOn_I for the in-phase path derived from the local oscillator signal. The first and fourth bipolar transistors 372, 378 are coupled to receive a second balanced signal LOp_I for the in-phase path derived from the local oscillator signal.

Each unit of the quadrature PSDAC 353 comprises a DAC field effect transistor (FET) 373, a first switch 375 and a second switch 377. The DAC FET 373 of the unit has a gate coupled to receive the bias signal from the bias source 354. The DAC FET 373 of the unit also has a conduction channel with a drain connected to the first and second switches 375, 377 and a source connected to ground. The first and second switches are controlled such that the first switch 375 is in the inverse state to the second switch 377. The first switch 375 receives a bit of the quadrature control signal Qctrl<1:$m$> from the DDS as described previously with reference to FIG. 2. The second switch 377 receives the inverse of the bit of the control signal Qctrlb<1:$m$>.

In the quadrature path, outputs from the first and second switches 375, 377 of each of the units 1:m of the PSDAC 353 are summed and provided to a quadrature mixer 342. The quadrature mixer 342 in this example comprises first, second, third and fourth bipolar transistors 382, 384, 386, 388. The bipolar transistors are NPN transistors in this example. The first and second bipolar transistors 382, 384 each have their emitters connected together and coupled to the first switches 374 of the quadrature PSDAC 353 for receiving a current to drive the phase shifter. The third and fourth bipolar transistors 386, 388 each have their emitters connected together and coupled to the second switches 376 of the quadrature PSDAC 353 for receiving a current to drive the phase shifter. As described above, driving the mixers of the phase shifter in current mode driving enables a reduction in output noise (phase noise and amplitude noise) and therefore considerably reduces NF desense issues in a transceiver context compared to a voltage drive phase shifter. The collectors of the second and fourth bipolar transistors 384, 388 provide an output of the quadrature mixer 342. The collectors of the first and third bipolar transistors 382, 386 provide a second output of the quadrature mixer 342. The bases of the second and third bipolar transistors 384, 386 are coupled to receive a first balanced signal LOn_Q for the quadrature path derived from the local oscillator signal. The first and fourth bipolar transistors 382, 388 are coupled to receive a second balanced signal LOp_Q for the quadrature path derived from the local oscillator signal.

The phase shifter 224 further comprises a branch line coupler 244, an in-phase balun 248 and a quadrature balun 250. The branch line coupler 244, convert an unbalanced local oscillator input signal LO_in into two unbalanced signals in quadrature (90° phase difference). The in-phase balun 248 and quadrature balun 250 both convert each unbalanced signal in quadrature to balanced local oscillator signals LOp_I, LOn_I, LOp_Q, LOn_Q. Each balun 248, 250 receives a bias from a bias unit 252.

The in-phase balun 248 is provided by a transformer with a first inductor and a second inductor on a common core. The first inductor is coupled between an in-phase output of the branch line coupler 244 and ground. The second inductor of the in-phase balun 248 has three terminals: a first end terminal, a second end terminal and a central tap terminal. The tapped off terminal is connected to the bias unit 352 to receive a bias voltage Vb_PS. The first and second end terminals provide the balanced in-phase local oscillator signals LOn_I, LOp_I.

The quadrature balun 250 is provided by a transformer with a first inductor and a second inductor on a common core. The first inductor is coupled between a quadrature output of the branch line coupler 244 and ground. The second inductor of the quadrature balun 250 has three terminals: a first end terminal, a second end terminal and a central tap terminal. The tapped off terminal is connected to the bias unit 252 to receive the bias voltage Vb_PS. The first and second end terminals provide the balanced quadrature local oscillator signals LOn_Q, LOp_Q. This balanced, or differential, signal is driven with the highest swing in order to reduce quad switching noise.

As described previously with reference to FIG. 2b the in-phase mixer 240 mixes the balanced local oscillator signal LOp_I, LOn_I with the balanced in-phase analogue signals ip_I, in_I to provide in-phase mixer output signals Mx_I_outp, Mx_I_outn to the power combiner 246. The quadrature mixer 242 mixes the balanced local oscillator signals LOp_Q, LOn_Q with the quadrature phase analogue signal ip_Q, in_Q to provide mixer output signals Mx_Q_outp, Mx_Q_outn to the power combiner 246. The in-phase and quadrature mixer output signals Mx_I_outp, Mx_I_outn, Mx_Q_outp, Mx_Q_outn may be voltage signals. The power combiner 246 combines the in-phase and quadrature mixer output signals Mx_I_outp, Mx_I_outn, Mx_Q_outp, Mx_Q_outn to provide phase shifter output signals PX_outp, PS_outn, a differential output with the programmed phase. The power combiner 246 is shown schematically in this example. The power combiner 246 may be implemented using convention bias voltage means.

The operation of the bias unit is described further below with reference to FIGS. 3 and 4.

Regarding FIG. 3, the bias unit 352 comprises a bias current source 390, a first bias switch 392, a second bias switch 394 and a load 396. The output terminal of the bias unit 352 provides the bias voltage Vb_PS to the in-phase and quadrature baluns 348, 350. The second bias switch 394 and the load 398 are provided in parallel between the output terminal 398 of the bias unit 352 and ground. The first bias switch 392 is provided between the current source 390 and the output terminal 398 of the bias unit 352. The first and second bias switches 392, 394 are controlled to occupy inverse states such that when the fast power down signal fpd is activated (logic level high) and the inverse fast power down signal fpd_b is deactivated (at logic level low), the second bias switch 394 is closed and the first bias switch 392 is open, and when the fast power down signal fpd is deactivated (logic level low) and the inverse fast power down signal fpd_b is activated (at logic level high), the second bias switch 394 is open and the first bias switch 392 is closed. The bias voltage Vb_PS is equal to the current of the bias current source 390 multiplied by the resistance of the load 396 (Vb_PS=Iref2×R2) when the first bias switch 392 is closed and at the ground potential when the second bias switch 394 is closed.

The bias unit 352 in combination with the baluns 350, 352 provide control circuitry configured to adjust the oscillator signal supplied to the mixer stage in accordance with the state of the phase shifter to activate or deactivate the mixer stage.

When the phase shifter is used in a transmitter, such as a FMCW radar transmitter, having a ramp-up state and a ramp-down state, a controller of the transmitter may be configured to send a control signal to the control circuitry of the phase shifter circuit, and specifically to the first and second bias switches 392, 394 of the bias unit 352 in order to set the bias in accordance with the state of the transmitter.

Figure 4:
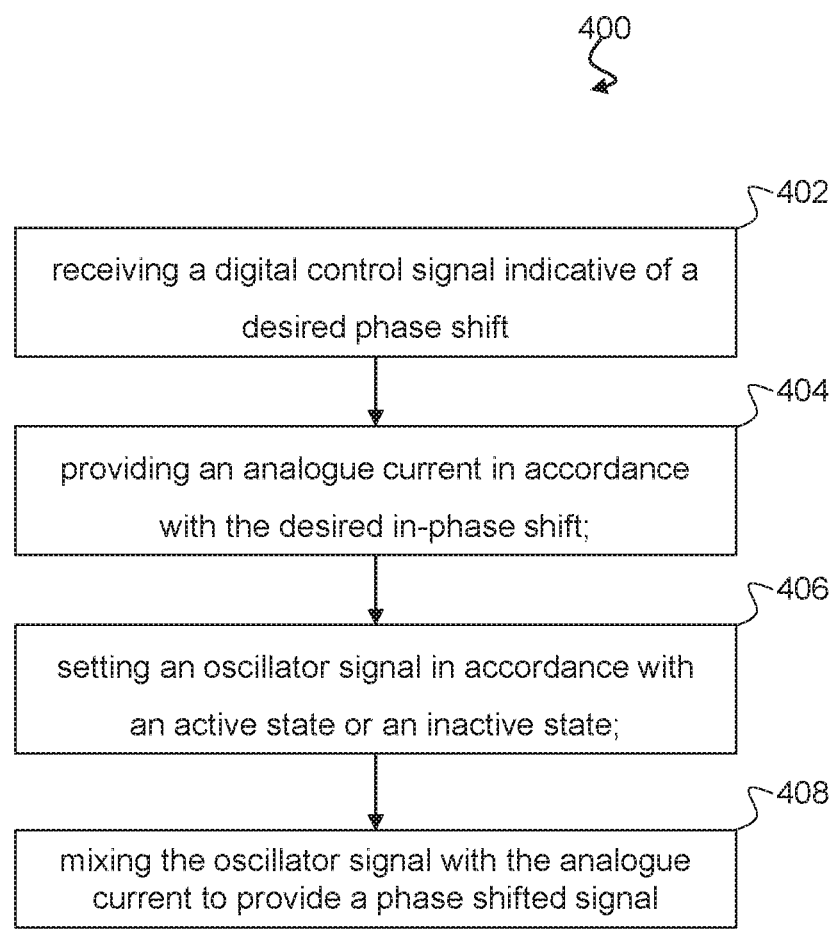
FIG. 4 shows a method of shifting a phase of an oscillator signal
Figure 5:
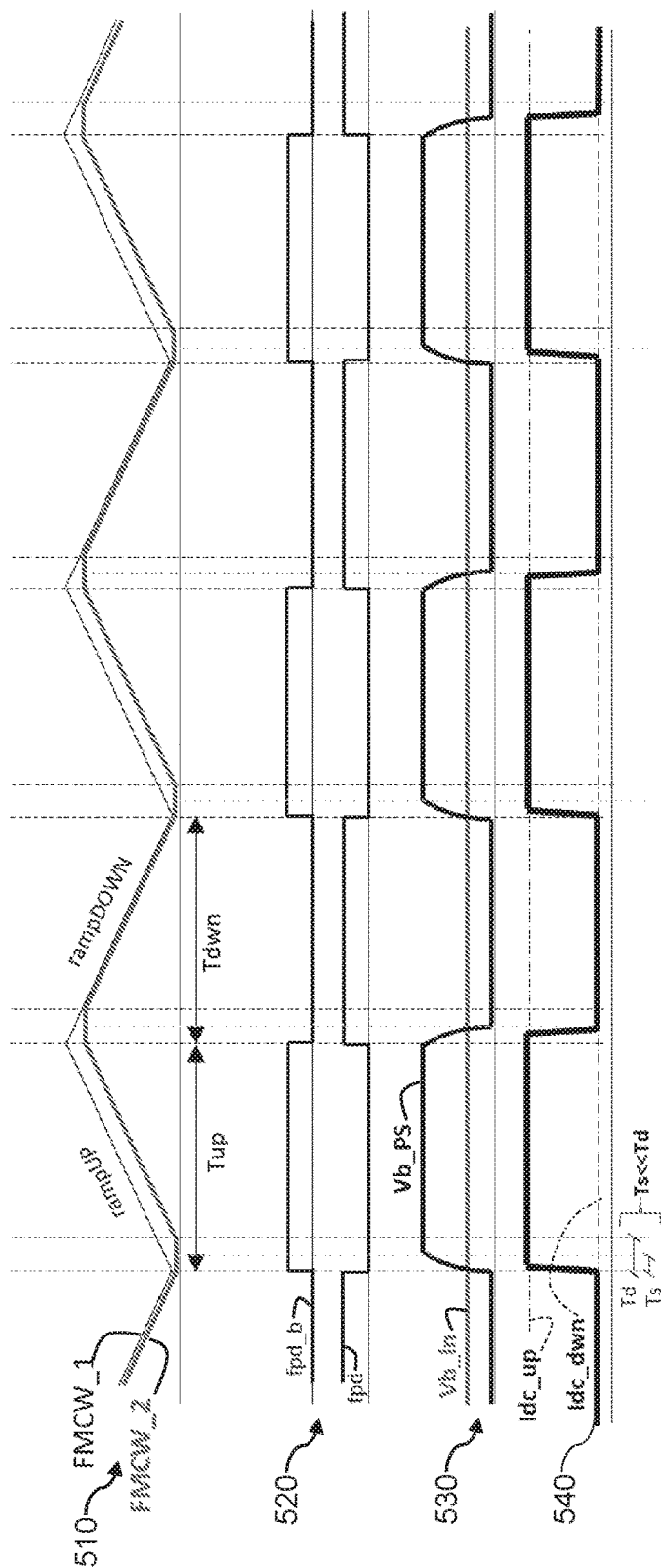
FIG. 5 shows a timing diagram for signals in the phase shifter digital-to-analogue converter and mixer module of the phase shifter of FIG. 3.

FIG. 4 illustrates a method 400 of shifting a phase of an oscillator signal which may be implemented by the circuit of FIG. 3, for example. A digital control signal indicative of a desired phase shift is received 402 and an analogue current is provided 404 in accordance with the desired in-phase shift. An oscillator signal is set 406 in accordance with an active state or an inactive state of the system and the oscillator signal is mixed 408 with the analogue current to provide a phase shifted signal. In some examples, a raw oscillator signal and to supply is received and adjusted to provide an oscillator signal in accordance with the state of the phase shifter. The adjusted oscillator signal is then mixed with the analogue current.

The method may be utilised in a FMCW radar transmitter, for example, for powering down a phase shifter at a beginning of an inter-chirp (dead time) period and powering up the phase shifter at a beginning of the chirp, in order to reduce the power consumption of the transmitter.

FIG. 4 shows a timing diagram for signals in the phase shifter digital-to-analogue converter and mixer module of the phase shifter of FIG. 3 operating using the Fast Re-settling time technique. Various signals are shown in terms of amplitude as a function of time:

FMCW ramp cycle signals 510, including a first ramp cycle FMCW_1 and a second ramp cycle FMCW_2;

fast power-up/power-down control signals 520, including a status control signal fpd and an inverse status control signal_b, which may be supplied from the digital controller of a transmitter to a bias unit of the phase shifter;

PSDAC signals 530, including a bias output Vb_In for gates of DAC FETs of the PSDACs and a bias voltage Vb_PS supplied by a bias unit of a phase shifter to baluns of the phase shifter; and phase shifter current consumption 540.

A first ramp cycle FMCW_1 is an ideal cycle that has linear ramp up Tup and ramp down Tdwn sections provided in turn. A second ramp cycle FMWC_2 includes a guard delay Td before the start of processing valid radar data, between ramp up and ramp down sections. The guard delay Td provides a re-settling time to account for PLL overshoot and undershoot in the transmitter, as well as for the re-settling time of all blocks powered down/up during FMCW modulation. The bias voltage Vb_PS in the mixer stage of the phase shifter transitions between ground in the ramp down Tdwn and a stable level in the ramp up Tup in a settling period Ts that is relatively short compared to the guard delay Td. During the first ramp cycle FMCW_1 ramp up Tup, the PSDACs and mixers of the phase shifter run in normal operation with a stable bias voltage Vb_PS in the mixer stage of the phase shifter.

The total phase shifter current consumption 540 is higher in the active state (ramp up Tup) than the inactive state (ramp down Tdwn). During the ramp up Tup, the phase shifter current consumption 540 equals the bias current of the bias unit of the phase shifter and the differential output current of the PSDACs (Idc_up=Iref2+Iout_diff, where Ioutdiff=Ioutp+Ioutn). The output current from the first and second switches of the PSDACs are Iout_p=abs[(($2^M$−code)/$2^M$)*K] and Iout_n=abs[((code)/$2^M$)*K], where K=Ratio*Iref1, Iref1 is the PSDAC bias current and the code is the control signal ctrl<1:$m$> received from the DDS.

At the beginning of interchirp, or ramp down Tdwn, the associated control signal fpd (fast power down) is sent from the controller to the bias unit of the phase shifter. The transitions in fast power-up/power-down control signals 520 between logic high and logic low are instantaneous. The second switch in the bias unit pulls down the bias output Vb_PS to ground, which results in making voltages across the PSDAC current source-drain equal to zero, which turns off the current sources provided by the DAC FETs 366, 372. During power down/up sequence, to avoid incurring a delay due to the time constant of the RC filter 360 of the PSDAC, the bias output Vb_In of the PSDAC is not pulled down and is at a constant level regardless of the FMCW ramp mode. This allows a fast re-settling time during the pdnw/pup sequence. During ramp down, the total phase shifter current consumption 540 equals the current source of the PSDAC bias unit (Idc_dwn=Iref1) because the current source of the PSDAC bias unit is then kept on during power down mode, but its value is substantially lower than the main PSDAC current (0.1 mA vs. 5 to mA) and so has a limited effect on overall power consumption.

The average current in the phase shifter Idc_t=Tup*Idc_up+Tdnw*Idc_dwn, where Tup is the ramp up period, Tdwn is the ramp down period, Idc_up is the current consumed during ramp up and Idc_dwn is the current consumed during ramp down. The average current for a system using the fast power down scheme (Idc_t_fpd) is about half of the average current for a system without the fast power down scheme (Idc_t_no_fpd). Therefore, using the proposed technique, the total current consumption of the entire symmetrical chirp (ramp up=ramp down) is divided by approximately two because current consumption in ramp down Tdwn is negligible compared to the current consumption during ramp up Tup. For a 3 TX channel solution, where 3 transmitter phase shifters are used, this allows reducing overall power consumption of the radar chip.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A phase shifter circuit having an active state and an inactive state, the phase shifter circuit comprising:
   a digital-to-analogue converter configured to receive a control signal indicative of a desired phase shift and to provide an analogue current in accordance with the desired phase shift;
   a mixer stage configured to mix an oscillator signal with the analogue current to provide a phase shifted signal; and
   control circuitry configured to provide the oscillator signal to the mixer stage in accordance with the state of the phase shifter to activate or deactivate the mixer stage.

2. The phase shifter circuit of claim 1, wherein the control circuitry is configured to receive a raw oscillator signal and to supply an adjusted oscillator signal to the mixer stage in accordance with the state of the phase shifter.

3. The phase shifter circuit of claim 1, wherein the control circuitry comprises a switchable bias voltage source and is configured to apply a first bias level to the mixer stage in the active state to activate the mixer stage and a different, second bias level to the mixer stage in the inactive state to deactivate the mixer stage.

4. The phase shifter circuit of claim 3, wherein the second bias level is a ground level.

5. The phase shifter circuit of claim 3, wherein the mixer stage and digital-to-analogue converter are arranged such that application of the second bias level to the mixer stage reduces a potential difference between an output of the digital-to-analogue converter at which the analogue current is provided and ground.

6. The phase shifter circuit of claim 3, wherein the control circuitry comprises a balun with a first inductor and a second inductor, wherein the first inductor is configured to receive an unbalanced oscillator signal, wherein the second inductor is configured to provide a balanced signal to a mixer of the mixer stage in accordance with the bias applied by the switchable bias voltage of the control circuitry.

7. The phase shifter circuit of claim 1, wherein the digital-to-analogue converter, DAC, is a current-summing converter with a plurality of units, the phase shifter circuit further comprising a DAC bias voltage source and a filter configured to provide a DAC bias voltage to each of the units of the digital-to-analogue converter.

8. The phase shifter circuit of claim 7, wherein the DAC bias voltage source is configured to provide the DAC bias voltage to the digital-to-analogue converter in both the active state and the inactive state.

9. The phase shifter circuit of claim 7, wherein each unit comprises a first DAC switch, a second DAC switch and a field effect transistor with a gate connected to the DAC bias voltage and a conduction channel connected to the first and second DAC switches.

10. The phase shifter circuit of claim 9, wherein:
    the mixer comprises first, second, third and fourth transistors, the first and second transistors each having a first junction coupled to the first DAC switches for receiving a current, the third and fourth transistors each having a first junction coupled to the second DAC switches for receiving a current, the second and fourth transistors each having second junctions for providing an output of the mixer, the first and third transistors each having second junctions for providing a second output of the mixer, the second and third transistors each having a control terminal for receiving a first balanced oscillator signal, and the first and fourth transistors each having a control terminal for receiving a second balanced oscillator signal.

11. The phase shifter circuit of claim 1, wherein the mixer stage comprises an in-phase mixer, a quadrature mixer and a power combiner configured to combine output signals from the in-phase and quadrature mixers.

12. A transmitter module having a ramp-up state and a ramp-down state, the transmitter module comprising:
    a digital-to-analogue converter configured to receive a control signal indicative of a desired phase shift and to provide an analogue current in accordance with the desired Phase shift;
    a mixer stage configured to mix an oscillator signal with the analogue current to provide a phase shifted signal;
    control circuitry configured to provide the oscillator signal to the mixer stage in accordance with the state of the phase shifter to activate or deactivate the mixer stage; and
    a controller configured to send a control signal to the control circuitry of the phase shifter circuit to set a state of the phase shifter circuit in accordance with the state of the transmitter.

13. The transmitter module of claim 12, wherein the transmitter module is a radar transmitter module.

14. A method of shifting a phase of an oscillator signal, comprising:
    receiving a digital control signal indicative of a desired phase shift;
    providing by way of a digital-to-analogue converter, DAC, an analogue current in accordance with the desired phase shift;

setting by way of control circuitry an oscillator signal in accordance with an active state or an inactive state; and mixing the oscillator signal with the analogue current by way of a mixer stage to provide a phase shifted signal.

15. A computer program configured to enable a processor to perform the method of claim 14.

16. The method of claim 14, further comprising receiving a raw oscillator signal at the control circuitry and supplying an adjusted oscillator signal to the mixer stage in accordance with the active state or the inactive state.

17. The method of claim 14, further comprising applying a first bias level to the mixer stage in the active state to activate the mixer stage and applying a second bias level to the mixer stage in the inactive state to deactivate the mixer stage, the second bias level different from the first bias level.

18. The method of claim 17, wherein the control circuitry comprises a balun with a first inductor and a second inductor, wherein the first inductor is configured to receive an unbalanced oscillator signal, and wherein the second inductor is configured to provide a balanced signal to a mixer of the mixer stage.

19. The method of claim 14, wherein the DAC is a current-summing converter with a plurality of units, and further comprising providing a DAC bias voltage to each of the units of the DAC.

20. The method of claim 14, wherein the mixer stage comprises an in-phase mixer, a quadrature mixer and a power combiner configured to combine output signals from the in-phase and quadrature mixers.

* * * * *